(12) United States Patent
Miaille et al.

(10) Patent No.: US 9,442,141 B2
(45) Date of Patent: Sep. 13, 2016

(54) ANALOGUE-TO-DIGITAL CONVERTER

(71) Applicant: QUALCOMM TECHNOLOGIES INTERNATIONAL, LTD., Cambridge (GB)

(72) Inventors: Gerald Miaille, Cambridge (GB); Michael John Story, Whittlesford (GB); Dimitrios Mavridis, Cambridge (GB)

(73) Assignee: QUALCOMM TECHNOLOGIES INTERNATIONAL, LTD., Cambridge (GB)

( * ) Notice: Subject to any disclaimer, the term of this patent is extended or adjusted under 35 U.S.C. 154(b) by 213 days.

(21) Appl. No.: 14/150,164

(22) Filed: Jan. 8, 2014

(65) Prior Publication Data
US 2015/0194975 A1    Jul. 9, 2015

(51) Int. Cl.
*G01R 23/02* (2006.01)
*G01R 23/00* (2006.01)
*H03M 3/00* (2006.01)

(52) U.S. Cl.
CPC ............ *G01R 23/00* (2013.01); *H03M 3/44* (2013.01); *H03M 3/42* (2013.01); *H03M 3/454* (2013.01); *H03M 3/466* (2013.01); *H03M 3/47* (2013.01)

(58) Field of Classification Search
CPC ....... G01R 23/00; G01R 23/02; G01R 23/09
USPC .............. 324/76.39, 76.11, 160, 76.12
See application file for complete search history.

(56) References Cited

U.S. PATENT DOCUMENTS

| | | | |
|---|---|---|---|
| 4,099,122 A * | 7/1978 | van Buul | G06T 9/005 348/472 |
| 4,914,439 A * | 4/1990 | Nakahashi | H03M 1/129 341/131 |
| 5,221,910 A | 6/1993 | Tournier | |
| 6,441,767 B1 * | 8/2002 | Frazier | H03M 1/0607 341/155 |
| 6,741,123 B1 * | 5/2004 | Andersen | H03F 3/2175 330/10 |
| 7,113,119 B2 * | 9/2006 | Van Veldhoven | H03M 3/348 341/143 |
| 7,265,625 B2 | 9/2007 | Klemmer | |
| 7,336,134 B1 | 2/2008 | Janesch et al. | |

(Continued)

FOREIGN PATENT DOCUMENTS

| CN | 101425780 A | 5/2009 |
|---|---|---|
| CN | 101895265 A | 11/2010 |

(Continued)

OTHER PUBLICATIONS

GB Search Report issued in related GB Application No. 1413956.2, dated Jan. 28, 2015.

(Continued)

*Primary Examiner* — Tung X Nguyen
*Assistant Examiner* — Dominic Hawkins
(74) *Attorney, Agent, or Firm* — Procopio, Cory, Hargreaves & Savitch LLP (57) ABSTRACT

An analogue-to-digital converter for converting an analogue input signal into a digital output signal, the analogue-to-digital converter including two conversion paths, each configured to receive a version of the analogue input signal and convert it into a digital bit stream, a first feedback loop configured to provide feed-back, to both paths, that is indicative of a difference between the digital bit streams output by the two paths, and a second feedback loop configured to feed-back, to both paths, that is indicative of an average of the digital bit streams output by the two paths.

20 Claims, 5 Drawing Sheets

(56) References Cited

U.S. PATENT DOCUMENTS

| | | | |
|---|---|---|---|
| 7,450,045 B2* | 11/2008 | Liu | H03M 3/474 341/143 |
| 7,705,577 B2* | 4/2010 | Li | H02M 3/157 323/283 |
| 8,354,886 B2 | 1/2013 | Brekelmans | |
| 8,519,878 B2* | 8/2013 | Jensen | H03M 3/396 341/120 |
| 2003/0216863 A1* | 11/2003 | Fielder | G01S 19/37 701/469 |
| 2004/0190660 A1 | 9/2004 | Morris et al. | |
| 2005/0012481 A1* | 1/2005 | Kang | G01D 5/24404 318/268 |
| 2005/0111318 A1* | 5/2005 | Nakajima | G11B 20/1403 369/47.27 |
| 2005/0174184 A1 | 8/2005 | Wu | |
| 2006/0097798 A1 | 5/2006 | Cojocaru | |
| 2006/0103462 A1* | 5/2006 | Capofreddi | H03F 1/0205 330/86 |
| 2007/0013570 A1* | 1/2007 | Gaggl | H03M 3/492 341/155 |
| 2008/0018508 A1 | 1/2008 | Filipovic et al. | |
| 2008/0018514 A1* | 1/2008 | Ryu | H03M 1/06 341/150 |
| 2008/0019066 A1* | 1/2008 | Meagher | G05B 9/02 361/79 |
| 2011/0285562 A1* | 11/2011 | Tsai | H03M 3/39 341/110 |
| 2012/0025921 A1 | 2/2012 | Yang et al. | |
| 2012/0146819 A1* | 6/2012 | Silva | G01R 19/02 341/110 |
| 2012/0201400 A1* | 8/2012 | Ayres | H03G 3/301 381/107 |
| 2013/0071113 A1* | 3/2013 | McKinstrie | H04B 10/291 398/39 |
| 2013/0141176 A1 | 6/2013 | Andrabi et al. | |
| 2013/0181783 A1 | 7/2013 | Upadhyaya | |
| 2013/0187803 A1* | 7/2013 | Kaald | H03M 3/37 341/143 |
| 2013/0308960 A1* | 11/2013 | Horikoshi | H03H 21/0012 398/209 |
| 2014/0062749 A1* | 3/2014 | Takaike | H03M 1/183 341/155 |
| 2015/0188489 A1 | 7/2015 | Story | |
| 2015/0188495 A1 | 7/2015 | Story | |

FOREIGN PATENT DOCUMENTS

| | | |
|---|---|---|
| EP | 0942531 A2 | 9/1999 |
| EP | 1801977 A1 | 6/2007 |
| JP | 2004282479 A | 10/2004 |
| JP | 2006314059 A | 11/2006 |
| KR | 101105380 B1 | 1/2012 |
| WO | 03049280 | 6/2003 |
| WO | 2006103626 A1 | 10/2006 |
| WO | 2009150611 A1 | 12/2009 |
| WO | 2012050676 A1 | 4/2012 |

OTHER PUBLICATIONS

GB Search Report issued in related GB Application No. 1413955.4, dated Jan. 26, 2015.
GB Search Report issued in related GB Application No. 1413956.2, dated Aug. 14, 2015, pp. 2.
GB Search Report issued in related GB Application No. 1413957.0, dated Dec. 29, 2014.

* cited by examiner

ANALOGUE-TO-DIGITAL CONVERTER

BACKGROUND

This invention relates to an analogue-to-digital converter, such as a sigma-delta modulator.

Figure 1:
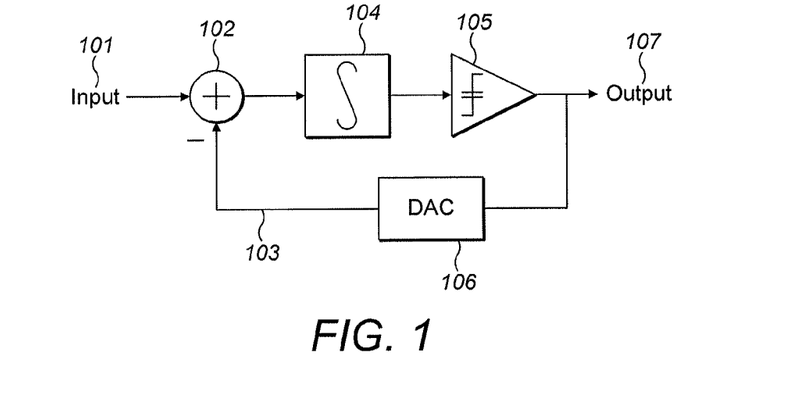
FIG. 1 shows a conventional sigma-delta modulator.

An example of a first order sigma-delta modulator is shown in FIG. 1. The sigma-delta modulator is an analogue-to-digital converter (ADC). It is configured to convert an analogue input signal 101 into a digital output signal 107. The sigma-delta modulator further comprises a summation unit 102, an integrator 104 and a quantiser 105. The conversion uses error feedback. The output signal is converted into an analogue signal 103 by digital-to-analogue (DAC) converter 106, and then subtracted from input signal 101 by summation unit 102. The sigma-delta modulator is configured to sample at a higher frequency than the input signal. The output takes the form of a high frequency stream of ones and zeros, with the relative proportion of ones to zeros representing the amplitude of the input signal.

Figure 2:
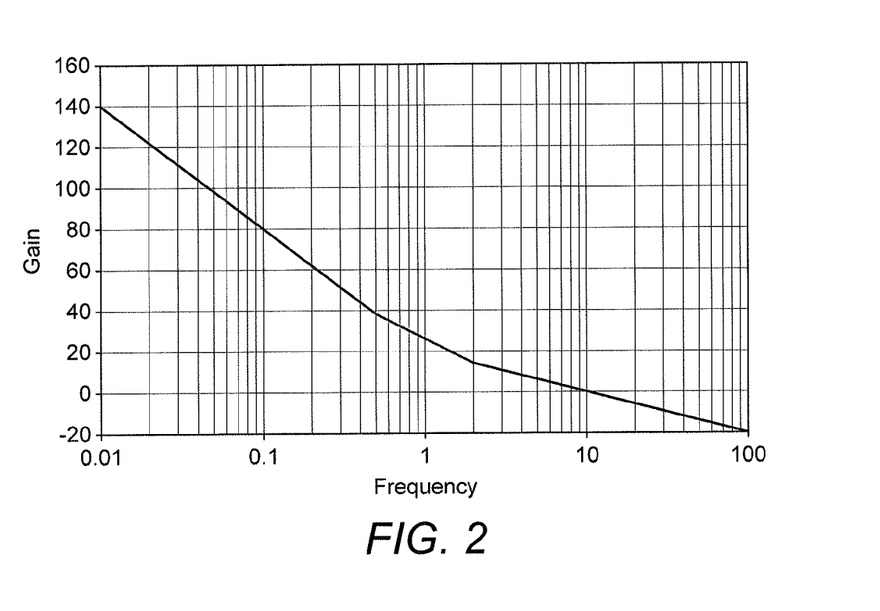
FIG. 2 shows an example of a gain-frequency plot for a sigma-delta modulator.

A sigma-delta ADC is a feedback system. An important issue with feedback systems is achieving stability. The over-riding requirement is that the phase shift is less than 180 degrees when the loop gain goes through 1 (0 dB). It is usual to design for a 90 degree phase shift, conveniently achieved by a "20 dB/decade" slope for the gain/frequency plot at a gain of 0 dB. An example of such a plot is shown in FIG. 2. The purpose of the feedback system is to suppress errors generated inside the loop via the loop gain. For a sigma delta ADC, the major error is due to the single bit quantisation. This "quantisation noise" (or Q noise) is suppressed at any given frequency by the loop gain. For example, in FIG. 2, the Q noise at frequency 0.1 is suppressed by 80 dB. Typically, in this low frequency part of its spectrum, an oversampling ADC is a useful device that gives a good signal to noise ratio. The noise left in at higher frequencies does not contain the wanted signal and can be digitally filtered out.

An example of a practical scenario in which sigma-delta modulators, are frequently deployed is in RF receivers. RF signals are typically mixed down to a lower frequency after receipt to make them easier to handle. In many receivers the mixed-down signal is fed into an ADC and then digitally processed. One simple, low power way of mixing is to use an analogue switch and switch the RF signal at some other frequency with gains of +1 and −1.

Either the +1 or the −1 signal might be used by the receiver but, in practice, mixing is a lossy process (it degrades signal to noise ratio) so it is preferable to use both the +1 and −1 versions. This might be achieved by feeding both versions into an ADC with a differential input. In this scenario the +1 version is subjected to +n gain and the −1 gain version is subject to −n gain. Many receivers, however, include circuitry that is inherently single-ended and thus not equipped to handle differential inputs. There is therefore a need for an improved ADC for handling both the +1 and −1 versions of a mixed signal.

SUMMARY OF THE INVENTION

According to a first embodiment, there is provided an analogue-to-digital converter for converting an analogue input signal into a digital output signal, the analogue-to-digital converter comprising two conversion paths, each configured to receive a version of the analogue input signal and convert it into a digital bit stream, a first feedback loop configured to provide feed-back, to both paths, that is indicative of a difference between the digital bit streams output by the two paths, and a second feedback loop configured to feed-back, to both paths, that is indicative of an average of the digital bit streams output by the two paths.

A first one of the conversion paths may be configured to apply a positive gain to its version of the analogue input signal.

A second one of the conversion paths may be configured to apply a negative gain to its version of the analogue input signal.

The analogue-to-digital converter may comprise a selection unit configured to form the digital output signal by alternately selecting between the digital bit streams output by the two conversion paths.

The selection unit may be configured to invert the digital bit stream output by the second conversion path before selecting it to form the digital output signal.

The first feedback loop may be configured to feedback a digital signal as the feedback that is indicative of a difference between the digital bit streams output by the two paths.

The first feedback loop may be configured to feed back the digital output signal as the feedback that is indicative of the difference between the digital bit streams output by the two paths.

The first feedback loop may be configured to feed back one of the digital bit streams as the feedback that is indicative of the difference between the output by the two paths.

The second feedback loop may be configured to feedback an analogue signal as feedback that is indicative of the average of the digital bit streams output by the two paths.

The second feedback loop may be configured to sum analogue versions of the digital bit streams output by each of the conversion paths to form the analogue signal.

Each of the conversion paths may comprise a latch configured to output the digital bit stream, and the second feedback loop may comprise an integrator configured to sum the analogue signals input into each latch to generate a signal indicative of the average of the digital bit streams output by the two paths.

Each conversion path may be configured to subtract the feedback indicative of the difference and the feedback indicative of the average from its version of the analogue input signal.

The second feedback loop may comprise a main loop and one or more subsidiary loop.

The main loop may be configured to provide integral control. The subsidiary loops may be configured to provide proportional control.

Each conversion path may comprise two or more integrators connected in series, the main loop may be configured to feed back the signal indicative of the average of the digital bit streams output by the two paths to the first integrator in each series.

Each conversion path may comprise two or more integrators connected in series, and each subsidiary loop may be configured to feed back the output of one of the integrators to an input of that integrator.

Each subsidiary loop in one conversion path may be connected to a corresponding subsidiary loop in the other conversion path.

Each conversion path may comprise two or more integrators connected in series, and the final integrator in each series may be configured to receive different feedback from the other integrators in its series.

The final integrator in each series may be configure to receive different feedback signals so as to compensate for a delay in the analogue-to-digital converter's feedback path.

Each of the first and second conversion paths may be a sigma-delta modulator.

According to a second embodiment, there is provided a control circuit for detecting an overload condition in an analogue-to-digital converter, the control circuit comprising a frequency detector configured to detect a frequency of digital pulses in a digital bit stream output by the analogue-to-digital converter, the control circuit being configured to determine that the analogue-to-digital converter is overloaded if that frequency drops below a predetermined threshold.

The control circuit may be configured to determine that the analogue-to-digital converter is overloaded if the detected frequency drops below a quarter of a sampling frequency used by the analogue-to-digital converter to form the digital bit stream.

The control circuit may be configured to control the gain of an amplifier in dependence on the detected frequency.

The control circuit may be configured to, if it determines that the analogue-to-digital converter is overloaded, reduce the gain of the amplifier.

The frequency detector may be configured to count a number of rising and/or falling edges in the digital bit stream output by the analogue-to-digital converter.

According to a third embodiment, there is provided a method for detecting an overload condition in an analogue-to-digital converter, the method comprising detecting a frequency of digital pulses in a digital bit stream output by the analogue-to-digital converter and determining that the analogue-to-digital converter is overloaded if that frequency drops below a predetermined threshold.

BRIEF DESCRIPTION OF THE DRAWINGS

The present invention will now be described by way of example with reference to the accompanying drawings. In the drawings.

DETAILED DESCRIPTION

Figure 3:
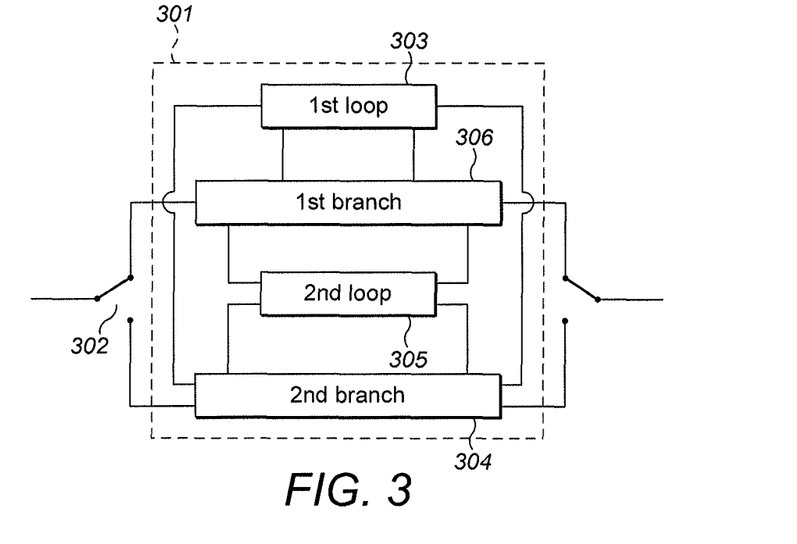
FIG. 3 shows an example of an analogue-to-digital converter.

FIG. 3 illustrates an example of an ADC, shown generally at 301. It comprises two conversion paths 304, 306, which are each configured to receive a version of an analogue input signal and convert it into a digital bit stream. Suitably the ADC is connected to a switch 302 that flips alternately between connecting the analogue input signal to the first path and connecting it to the second path. The ADC also comprises two feedback loops: a first loop 303 configured to feed back a signal indicative of a difference between the bit streams output by the two paths; and a second feedback loop 305 configured to feed back a signal indicative of an average of those bit streams.

The two conversion paths are substantially identical, but one preferably provides the inverse gain of the other. For example, one path may provide +n gain and the other may provide −n gain. The ADC is thus suitable for use in an RF receiver where it is desired to both mix the received signal down to an intermediate frequency and digitise it. To get the data back to a single bit stream, alternate outputs may be taken from the two paths. The ADC shown in FIG. 3 is capable of not only generating a single bit stream from a differential input but also of providing common mode stability. The first feedback loop may compensate for errors generated inside the loop, usually due to quantisation of an analogue signal. It may also prevent the two paths of the ADC from diverging. The second feedback loop provides common mode stability.

Figure 4:
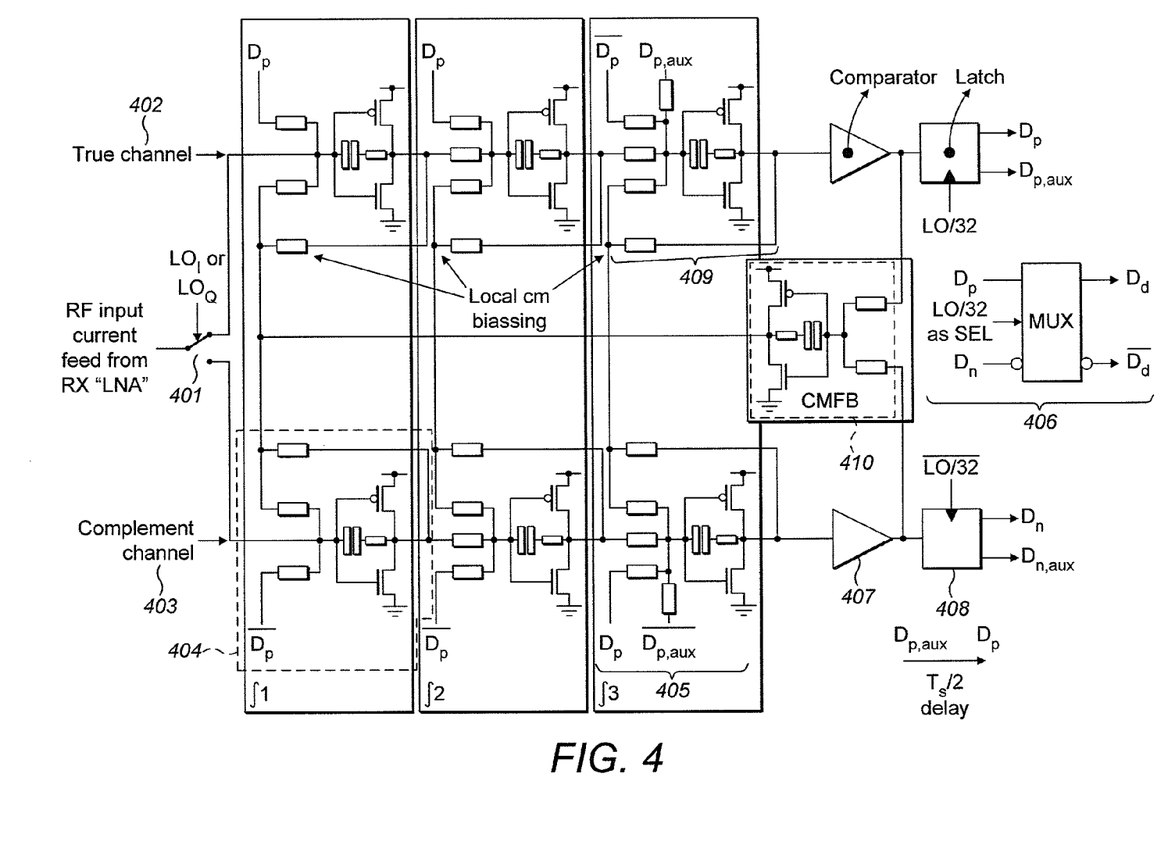
FIG. 4 shows an example of an analogue-to-digital converter.

A more detailed example of an ADC is shown in FIG. 4. This ADC may be configured to form part of an RF receiver. The structure is differential. Switch 401 may be configured to mix the incoming RF signal to a lower frequency by alternately switching the input signal to the first path 402 of the ADC or the second path 403. This switching is suitably carried out at the local oscillator frequency (either in-phase or quadrature). Two ADCs, such as that illustrated in FIG. 4, may be provided in an RF receiver: one for each of the in-phase and quadrature channels.

In FIG. 4 both the first and second paths are implemented as a single bit oversampling ADC, such as a sigma-delta modulator, although any other suitable circuit for converting an analogue input into a digital output might be used. In this example, third order sigma-delta modulators are used for improved noise shaping. Each path therefore includes three integrators 404. Each integrator acts as a low pass filter. They also act as summation units for receiving differential and common mode feedback signals. Each path also has a single-bit quantiser 407 and a latch 408. The latches in the two paths are clocked out of phase with each other. The upper path acts as a "true" channel, providing a gain of +n, and the lower path acts as a "complementary channel", providing a gain of −n.

The third order sigma-delta modulator is shown for the purposes of example only. The techniques described herein may be adapted to any number of integrators, as would be readily understood by one of skill in the art. The techniques described herein are also not limited to single-bit quantisers, and may be adapted to ADCs using multiple-bit quantisers.

Each ADC produces its own bit stream ($D_p$, $D_n$), which are very highly correlated. They are not perfectly correlated because the low level noise in each is different, but the divergence is small. It is possible to get back to a single bit stream at the sampling rate, rather than two streams, by alternately taking $D_p$, then the inverse of $D_n$, then $D_p$, then the inverse of $D_n$ etc. as the output of the ADC. This may be achieved for example, by means of a multiplexor with one inverting input, such as that shown at 406.

The selected output $D_d$ may be used as the common feedback signal for both conversion paths. This signal provides differential feedback; the digital bit stream output by the complement channel is inverted so a signal that alternates between that and the true channel is indicative of a difference between the two digital bit streams. The feedback signal may be inverted for some of the integrators, reflecting the inversion of $D_n$ used to form the feedback signal and the passage of signals through the ADC from one clock cycle to the next.

Another possibility is to feedback the output bit stream of just one of the paths as the common feedback signal. This is acceptable because $D_p$ and $D_n$ are highly correlated, meaning that either can essentially be substituted for $D_d$ as feedback indicative of the difference between the bit streams output by the two paths. This may be preferable for implementation reasons to feeding back $D_d$. $D_d$ may be sent to a digital block following the ADC for further processing while $D_p$ or $D_n$ is fed back to the integrators. $D_d$ can then simply be buffered to drive the next stage. In FIG. 4, the output of the first conversion path $D_p$ provides the differential feedback. $D_p$ is non-inverted for the first conversion path and inverted for the second path. Feeding back $D_p$ to the second path will prevent the second path from diverging from the first.

The exact feedback provided to each path may be implementation-specific. In the example of FIG. 4, the first path uses $D_p$ for the first and second integrators and an inverted version of $D_p$ for the third. This is just an example and the exact arrangement of inverted/non-inverted feedback may be adapted to the specific implementation. The feedback signals do, however, need to be complementary for the two paths. This can be seen in FIG. 4.

From a system-level perspective, the feedback coefficients are optimised for maximum signal-to-noise ratio (SNR).

If the ADCs move apart, the differential feedback arrangement controls them very well but it has little effect if both bit streams start to drift in the same direction.

The feedback signal for common mode stability is preferably indicative of an average of the digital bit streams output by the two conversion paths. This signal suitably alternates between those digital bit streams, effectively averaging them. Such a signal could be generated in a similar fashion to the differential feedback signal, i.e. using a multiplexor that selects alternately between the two bit streams (but without the inverting input for the second path's output). This is not preferred option, however.

For the main, differential ADC feedback path, the gain of the comparators has no effect on the ADC loop gain calculation because it has no effect on the output. This is because the output is either 1 or 0, and the comparator gain only affects the precision of the switch point. For the common mode feedback loop, however, this is not the case. The entire common mode loop is analogue, and the comparator gain is important. The common mode feedback signal is preferably analogue too.

For each integrator pair, the signals at the inputs and outputs are nominally equal and opposite in the +n and −n channels. Therefore, the average of an input/output pair across the two conversion paths only contains the common mode part of the signal. Feeding back the average equally to both sides provides the necessary common mode compensation. This does not affect the differential frequency response, which is important to ADC operation. It also enables extra degrees of freedom in configuring the common mode feedback loop to be stable.

In one embodiment the common mode feedback may be provided by two loops: one that provides substantially instant feedback based on the average error across corresponding integrators in the true and complementary conversion paths; and another that accumulates the average of any remaining error across the true and complementary conversion paths.

The common mode feedback loop comprises local loops connecting the input and output of at least some of the integrators. An example is shown at 409 in FIG. 4. The local loops shown in FIG. 4 provide proportional control based on the current common mode error for each integrator pair. Each loop may comprise a large resistor connecting the input and the output. The common mode loop gain is large, which has the potential to make the loop unstable. To address this the common mode feedback loop also comprises a second loop that spans several of the integrators. This second loop provides integral control. An example is shown at 410 in FIG. 4 and comprises a dedicated integrator that receives the mid-rail of the two conversion paths as its inputs and which outputs to the inputs of each conversion path. The dedicated integrator receives the inputs to the latches (rather than their outputs) to generate the required analogue control signal. The dedicated integrator preferably has large passive elements, providing relatively slow-moving control.

Figure 5:
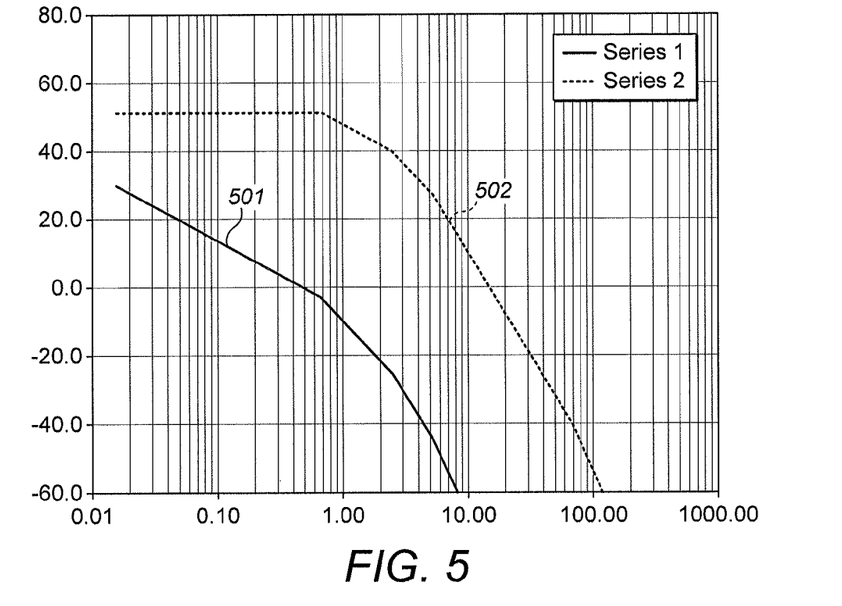
FIG. 5 shows an example of a gain-frequency plot for an analogue-to-digital converter.

FIG. 5 shows a gain-frequency plot for the circuit shown in FIG. 4. The left-most plot 501 shows a suitably stable frequency response for the second (common mode) feedback loop, with the desired slope of −20 dB/decade at 0 dB loop gain. To ensure better stability, the change of slope from −20 dB/decade to −40 dB/decade should preferably take place after the zero crossing (as shown). The right-most plot 502 shows a gain-frequency plot for the first (differential) feedback loop.

The ADC preferably presents a virtual earth to the mixer so that it is current-driven. This minimises non-linearity in the previous stage and limits kickback noise from the ADC. One further point of note in the circuit of FIG. 4 is that the final integrator in each conversion path is provided with two differential feedback coefficients. One of those coefficients ($D_{paux}$) may lead the other ($D_p$) by half a clock period to achieve overloading improvements. It may be generated in the latch. The feedback coefficients for the final integrator are also configured to perform excess loop delay compensation (ELD). Sigma-delta modulators are sensitive to delays in their feedback paths, which may cause instability. The final integrator in each path is provided with inverted versions of the feedback coefficients provided to the other integrators in its path for ELD compensation purposes. This compensation is only performed in the final integrator, and hence only the final integrator receives the inverted feedback coefficients.

An ADC is typically designed to withstand overloaded signals, i.e. signals whose amplitude exceeds the input range of the ADC. In an RF receiver, for example, a detected overload condition can be dealt with by adjusting the gain in a preceding amplification stage. Overloaded signals can cause the integrators in a sigma-delta modulator to saturate and are conventionally detected via a comparator connected to each integrator. The comparators use a relatively significant amount of current, however, which is not ideal in low-power implementations.

Figure 6:
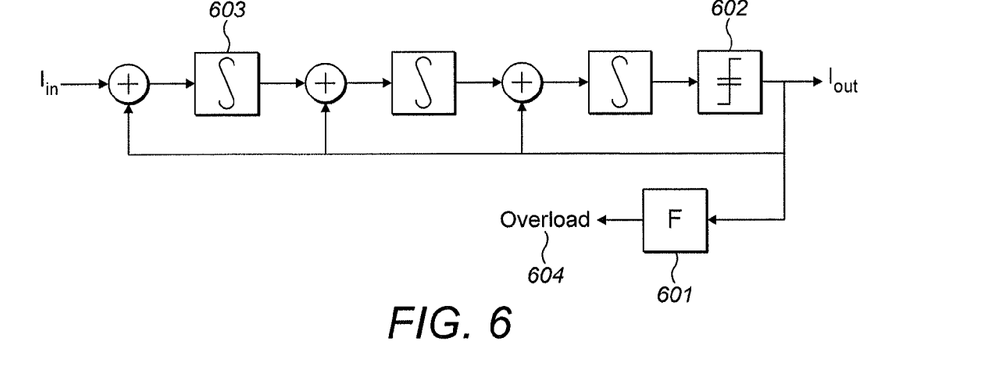
FIG. 6 shows an example of a sigma-delta modulator.

An alternative implementation is shown in FIG. 6. The figure illustrates an ADC comprising three integrators 603, however, this is for the purposes of illustration only and any number of integrators might be used. At the output of the ADC is a control circuit 601 for detecting an overload condition. The control circuit may comprise a frequency detector for determining an indication of the frequency of digital pulses in the digital output signal.

In a quiescent state, with no input signal, the ADC will normally output a stream of alternating ones and zeros. The frequency of this bit stream will be half the sampling frequency of the quantiser 602 (i.e. $F_s/2$). With an input signal, the frequency of ones and zeros in the output signal changes according to the amplitude of the input signal relative to the input range of the ADC. If the input signal breaches the boundaries of the ADC's input range, the ADC outputs either all ones or all zeros, depending on whether the input signal has breached the upper or lower limit of the ADC's input range respectively. The frequency detector may therefore be configured to interpret the frequency of the digital output signal as an indication of an overload condition in the ADC.

The frequency detector may be implemented as an edge counter. The frequency detector could for example, be configured to count either rising or falling edges in the output signal.

Figure 7:
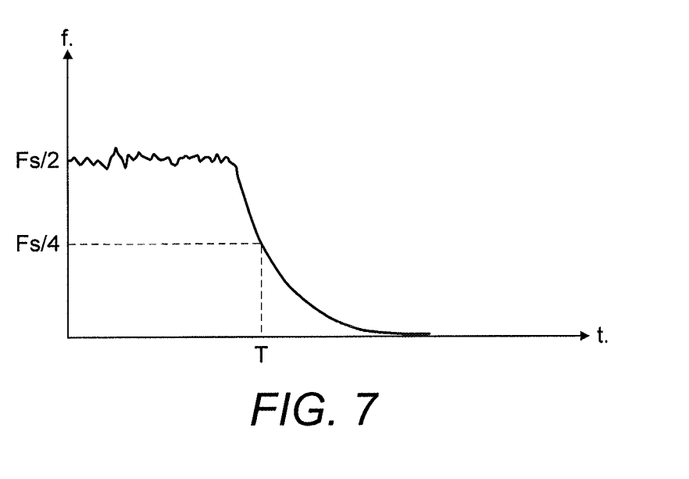
FIG. 7 shows an example of frequency against time for a digital output signal when the ADC suffers an overload condition.

When the control circuit detects an overload condition, it may output a signal 604 that causes the gain of a preceding amplifier to be reduced. A suitable threshold for detecting an overload condition might be $F_s/4$, as shown in FIG. 7, when an overload condition causes the frequency of the output signal to fall rapidly and is detected at time T. Similarly, if the control circuit detects that the frequency of the output signal has been within a predetermined range of $F_s/2$ for a predetermined period of time, it may increase the gain of a preceding amplifier to achieve better resolution of the input signal.

Figure 8:
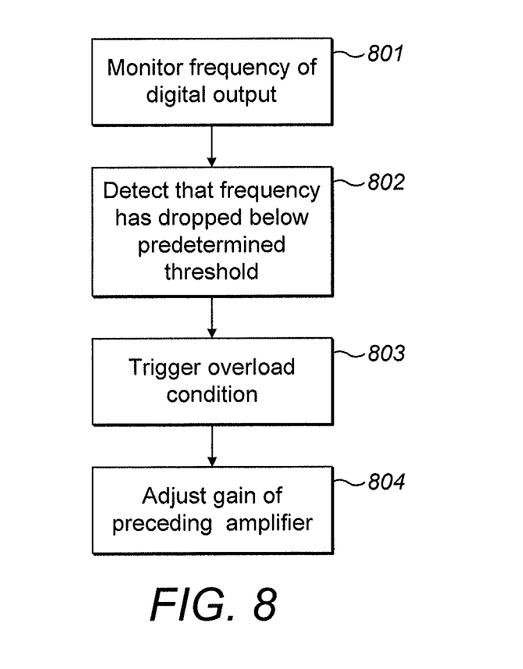
FIG. 8 shows an example of a method for determining an overload condition in a sigma-delta modulator.

An example of a method for detecting an overload condition in an ADC is shown in FIG. 8. The method comprises monitoring a frequency of a digital output signal (step 801) and detecting that it has fallen below a predetermined threshold (step 802). This determination triggers an overload exception (step 803), which optionally may cause the gain of a preceding amplification stage to be adjusted (step 804).

The control circuitry may be sued to control any suitable ADC, but it may be particularly well-suited to oversampling ADCs such as sigma-delta modulators. In particular, the control circuit may be implemented with any of the analogue-to-digital converters described herein.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. An analogue-to-digital converter for converting an analogue input signal into a digital output signal, the analogue-to-digital converter comprising:
a first conversion path configured to receive a first version of the analogue input signal and convert it into a first digital bit stream;
a second conversion path configured to receive a second version of the analogue input signal and convert it into a second digital bit stream;
a first feedback loop configured to provide feedback, to the first conversion path and the second conversion path, that is indicative of a difference between the first digital bit stream and the second digital bit stream; and
a second feedback loop configured to provide feedback, to the first conversion path and the second conversion path, that is indicative of an average of the first digital bit stream and the second digital bit stream.

2. The analogue-to-digital converter as claimed in claim 1, wherein the first conversion path is configured to apply a positive gain to the first version of the analogue input signal, and wherein the second conversion path is configured to apply a negative gain to the second version of the analogue input signal.

3. The analogue-to-digital converter as claimed in claim 1, further comprising a selection unit configured to form the digital output signal by alternately selecting between the first digital bit stream and the second digital bit stream.

4. The analogue-to-digital converter as claimed in claim 3, wherein the selection unit is further configured to invert the second digital bit stream before selecting it to form the digital output signal.

5. The analogue-to-digital converter as claimed in claim 1, wherein the first feedback loop is further configured to feed back a digital signal as the feedback that is indicative of a difference between the first digital bit stream and the second digital bit stream.

6. The analogue-to-digital converter as claimed in claim 1, wherein the first feedback loop is further configured to feed back the digital output signal as the feedback that is indicative of the difference between the first digital bit stream and the second digital bit stream.

7. The analogue-to-digital converter as claimed in claim 1, wherein the first feedback loop is further configured to feed back one of the first digital bit stream and the second digital bit stream as the feedback that is indicative of the difference between the first digital bit stream and the second digital bit stream.

8. The analogue-to-digital converter as claimed in claim 1, wherein the second feedback loop is further configured to feedback an analogue feedback signal as the feedback that is indicative of the average of the first digital bit stream and the second digital bit stream.

9. The analogue-to-digital converter as claimed in claim 8, wherein the second feedback loop is further configured to sum analogue versions of the first digital bit stream and the second digital bit stream to form the analogue feedback signal.

10. The analogue-to-digital converter as claimed in claim 1, wherein the first conversion path comprises a first latch configured to output the first digital bit stream, the second conversion path comprises a second latch configured to output the second digital bit stream, and the second feedback loop comprises an integrator configured to sum an analogue signal input into the first latch and an analogue signal input into the second latch to generate at least part of the feedback that is indicative of the average of the first digital bit stream and the second digital bit stream.

11. The analogue-to-digital converter as claimed in claim 1, wherein the first conversion path is further configured to subtract the feedback that is indicative of the difference and the feedback that is indicative of the average from the first version of the analogue input signal, and the second conversion path is further configured to subtract the feedback that is indicative of the difference and the feedback that is indicative of the average from the second version of the analogue input signal.

12. The analogue-to-digital converter as claimed in claim 1, wherein the second feedback loop comprises a main loop and one or more local loops, the main loop being configured to provide integral control, the one or more local loops being configured to provide proportional control.

13. The analogue-to-digital converter as claimed in claim 12, wherein the first conversion path comprises two or more integrators connected in series, the second conversion path comprises two or more integrators connected in series, and the main loop is configured to feed back a signal indicative of the average of the first digital bit stream and the second digital bit stream to a first integrator of the two or more integrators of the first conversion path and to a first integrator of the two or more integrators of the second conversion path.

14. The analogue-to-digital converter as claimed in claim 12, wherein the first conversion path comprises two or more integrators connected in series, the second conversion path comprises two or more integrators connected in series, and wherein each of the one or more local loops is configured to feed back an output of one of the integrators to an input of that integrator.

15. The analogue-to-digital converter as claimed in claim 14, wherein each of the one or more local loops is further configured to connect to an integrator in the first conversion path to a corresponding integrator in the second conversion path.

16. The analogue-to-digital converter as claimed in claim 1, wherein the first conversion path comprises two or more integrators connected in series, the second conversion path comprises two or more integrators connected in series, and wherein a final integrator of the two or more integrators of the first conversion path is configured to receive different feedback from the other integrators of the two or more integrators of the first conversion path and a final integrator of the two or more integrators of the second conversion path is configured to receive different feedback from the other integrators of the two or more integrators of the second conversion path.

17. The analogue-to-digital converter as claimed in claim 16, wherein the feedback received by the final integrator of the two or more integrators of the first conversion path differs from the feedback received by the other integrators of the two or more integrators of the first conversion path in delay, and wherein the feedback received by the final integrator of the two or more integrators of the second conversion path differs from the feedback received by the other integrators of the two or more integrators of the second conversion path in delay.

18. The analogue-to-digital converter as claimed in claim 1, wherein the first conversion path includes a sigma-delta modulator and the second conversion path includes a sigma-delta modulator.

19. The analogue-to-digital converter as claimed in claim 1, further comprising an input switch configured to alternately connect the analogue input signal to the first conversion path and to the second conversion path.

20. The analogue-to-digital converter as claimed in claim 19, wherein the analogue input signal is a radio-frequency signal, wherein the input switch alternately connects the analogue input signal at a local oscillator frequency, and wherein the local oscillator frequency is chosen to mix the analogue input signal down to an intermediate frequency.

* * * * *